US006529149B1

(12) United States Patent
Karanicolas

(10) Patent No.: US 6,529,149 B1
(45) Date of Patent: Mar. 4, 2003

(54) DIGITAL SELF-CALIBRATION OF A DIGITAL-TO-ANALOG CONVERTER

(75) Inventor: Andrew Karanicolas, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/045,827

(22) Filed: Oct. 26, 2001

(51) Int. Cl.[7] ................................................ H03M 1/10
(52) U.S. Cl. ........................ 341/120; 341/118; 341/144; 341/138; 341/153
(58) Field of Search ................................ 341/118, 120, 341/144, 138, 153

(56) References Cited

U.S. PATENT DOCUMENTS

| | | | |
|---|---|---|---|
| 4,336,526 A | | 6/1982 | Weir |
| 4,465,996 A | | 8/1984 | Boyacigiller et al. |
| 4,843,392 A | | 6/1989 | Gulczynski |
| 5,499,027 A | * | 3/1996 | Karanicolas et al. ........ 341/144 |
| 5,517,191 A | | 5/1996 | Wynne |
| 5,583,501 A | | 12/1996 | Henrion et al. |
| 5,666,118 A | | 9/1997 | Gersbach |
| 5,668,549 A | * | 9/1997 | Opris et al. .................. 341/118 |
| 5,703,582 A | * | 12/1997 | Koyama et al. ............. 341/120 |
| 5,929,796 A | * | 7/1999 | Opris et al. .................. 341/120 |
| 6,130,632 A | * | 10/2000 | Opris .......................... 341/120 |
| 6,348,885 B1 | * | 2/2002 | Munoz et al. ............... 341/118 |

OTHER PUBLICATIONS

Z. Boyacigiller, et al., "An Error–Correcting 14–b/20 u s CMOS A/D Converter," in Proc. IEEE Int. Solid–State Circuits Conf., 1981, pp. 62–63, ISSN: 0193–6530, Publisher: Lewis Winner, FL, USA.

A.B. Grebene, "Bipolar and MOS Analog Integrated Circuit Design: Chapter 14: Data Conversion Circuits: Digital-To-Analog Converters," 1984, pp. 753–824, Publisher: Wiley, NY, USA.

H.–Seung Lee, et al., "A Self–Calibrating 15–b CMOS A/D Converter," Dec. 1984, IEEE J. Solid–State Circuits, vol. SC–19, No. 6, pp. 813–819.

A. N. Karanicolas, et al., "A 15–b 1–Msample/s Digitally Self–Calibrated Pipeline ADC," Dec. 1993, IEEE J. Solid-State Circuits, vol. SC–28, No. 12, pp. 1207–1215.

* cited by examiner

Primary Examiner—Michael Tokar
Assistant Examiner—Khai Nguyen
(74) Attorney, Agent, or Firm—Blakely, Sokoloff, Taylor & Zafman LLP

(57) ABSTRACT

A digital-to-analog converter containing one or more ideal stages, a reduced-radix stage coupled with the one or more ideal stages, and a digital calibration logic section to operate on a calibration value. The calibration value is the difference between a first calibration constant and a second calibration constant. Digital input codes are received through the digital logic section. The calibration value is added to digital input codes with values that exceed the value of the second calibration constant. The outputs of the digital logic section are input to all stages of the digital-to-analog converter.

26 Claims, 9 Drawing Sheets

DIGITAL SELF-CALIBRATION OF A DIGITAL-TO-ANALOG CONVERTER

FIELD OF THE INVENTION

The present invention relates to a digital-to-analog converter. More particularly, the present invention relates to digital self-calibration of a digital-to-analog converter.

BACKGROUND OF THE INVENTION

A digital-to-analog converter (DAC) transforms digital input codes into an analog output signal consisting of a range of analog values. DACs are used in a wide variety of applications including data conversion systems and digital communications systems.

Characteristics that determine the performance quality of a DAC include resolution, sampling rate, linearity and monotonicity. Resolution is the number of bits of digital input code used to produce the corresponding analog output signal. The higher the resolution, the more accurately the digital input can be converted to an analog equivalent. Next, the sampling rate indicates the rate at which the digital input codes are converted to analog outputs. Linearity reflects that for each change in the digital input code, there is a proportionate change in the analog output. If a DAC is ideally linear, then the analog output values will increase uniformly by a constant amount as the values of the digital input increase. "Differential Non-Linearity" is the deviation from ideal linearity of the analog output signal measured between two successive digital input codes. Finally, a DAC exhibits monotonicity if in its transfer characteristic (a graph of the analog output as a function of the digital input), increasing digital input results in increasing analog output, i.e., as the values of the digital input codes increase, the values of the analog outputs never decrease. Thus, a DAC exhibits non-monotonicity if an incremental increase in the digital input results in an incremental decrease in the analog output.

A number of DAC designs are well-known in the art. One such design is a binary-weighted DAC, which converts digital input code to an analog output by assigning a weight to each bit in the digital input code, and summing the of the entire code.

FIG. 1 shows a current-steering DAC with the most significant bit (MSB) stage based on radix a, and the remaining stages based on radix 2. The following polynomial expresses the total analog output, $I_{out}$, of the current-steering DAC in FIG. 1:

$$I_{out}=(I/2^N)(b_N a^{N-1}+b_{N-1}2^{N-2}+\ldots b_2 2^1+b_1 2^0),$$

where N is the number of bits (each represented by a current source) contained in the digital input code. The quantity a is the radix of the MSB stage. When a equals 2, the result is a binary-weighted current-steering DAC. When a is other than 2, the result is a non-radix 2 current-steering DAC. The bit coefficients $b_1$, $b_2$, etc., are either 1 or 0 as the current source is switched (or steered) to direct the current. A current source is steered to ground for a 0, or through the circuit for a 1, depending on whether the bit of digital input code represented by the current source is a 0 or a 1. Among the bit coefficients, $b_N$ is bit coefficient for the MSB, while $b_1$ is bit coefficient for the least significant bit (LSB). The term corresponding to the MSB, $b_N a^{N-1}$, is based on radix a, while the terms of the other bits are based on radix 2.

FIG. 2A shows an ideal transfer characteristic of a binary-weighted current-steering DAC. As the polynomial above illustrates, the total analog current output of a current-steering DAC can be expressed as a linear combination of the current sources. Ideally, the current source ratios are exactly a factor of 2, in which case the DAC is binary-weighted and its transfer characteristic is ideal, as shown in FIG. 2A. As stated previously, a binary-weighted DAC results when a=2 in the above polynomial.

FIG. 2B shows the effect on the transfer characteristic when a<2 in the above polynomial. When a<2, errors are introduced in the analog output of the current-steering DAC. The errors result in, among other things, nonlinearity and nonmonotonicity in the transfer characteristic of the DAC. When a<2, the transfer characteristic is monotonic until the MSB changes from a 0 to a 1. When the MSB changes from a 0 to a 1, the analog output jumps in the negative direction, introducing nonmonotonicity and nonlinearity in the transfer characteristic of the DAC. The nonmonotonicity and non-linearity occur only at the MSB transition from a 0 to a 1. After the transition, the transfer characteristic is again monotonic and linear.

When a<2, the DAC is referred to as a reduced-radix DAC. In traditional DACs, analog calibration methods are used to avoid the reduced-radix situation, and achieve high resolution (e.g., 12-bit or higher resolution). However, analog calibration methods require special procedures, processes and layouts. In addition, changes in the operating environment, such as a change in temperature, over the life of the DAC may alter the analog calibration.

BRIEF DESCRIPTION OF THE DRAWINGS

The invention is illustrated by way of example, and not by way of limitation, in the figures of the accompanying drawings in which like reference numerals refer to similar elements.

FIG. 1 is an example of a current-steering DAC with the MSB based on radix a.

DETAILED DESCRIPTION

Digital self-calibration of a digital-to-analog converter (DAC) is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

As described in greater detail below, in order to calibrate a reduced-radix stage using the digital self-calibration technique described herein, a digital calibration logic section is added to a DAC containing one or more ideal stages and an uncalibrated reduced-radix stage. Calibration constants $S_1$ and $S_2$ are a pair of digital input codes that produce the same analog output and exist due to the nonmonotonicity caused by the uncalibrated reduced-radix stage. $S_1$ and $S_2$ are determined for the reduced-radix stage, and the difference between $S_1$ and $S_2$ ($S_1-S_2$) is calculated.

Digital input codes are input to the digital calibration logic section. Digital input codes with values that are less than or equal to the value of $S_2$ are not affected by the digital calibration logic section. Once the values of the digital input codes exceed $S_2$, however, the difference ($S_1-S_2$) is added to the digital input codes. Finally, the outputs of the digital calibration logic section, i.e., the digital input codes not affected by the digital calibration logic section, as well as the digital input codes increased by the amount ($S_1-S_2$), are input to the stages of the DAC. This calibrates the reduced-radix stage to remove the nonmonotonicity and nonlinearity that otherwise would be present in the transfer characteristic of the DAC without the digital calibration logic section. The digital calibration logic section, when added to the DAC containing the uncalibrated reduced-radix stage, results in a linearized DAC. If a DAC contains multiple reduced-radix stages, a separate digital calibration logic section for each reduced-radix stage and calibration constants determined for each reduced-radix stage are used to calibrate each reduced-radix stage.

Figure 1:
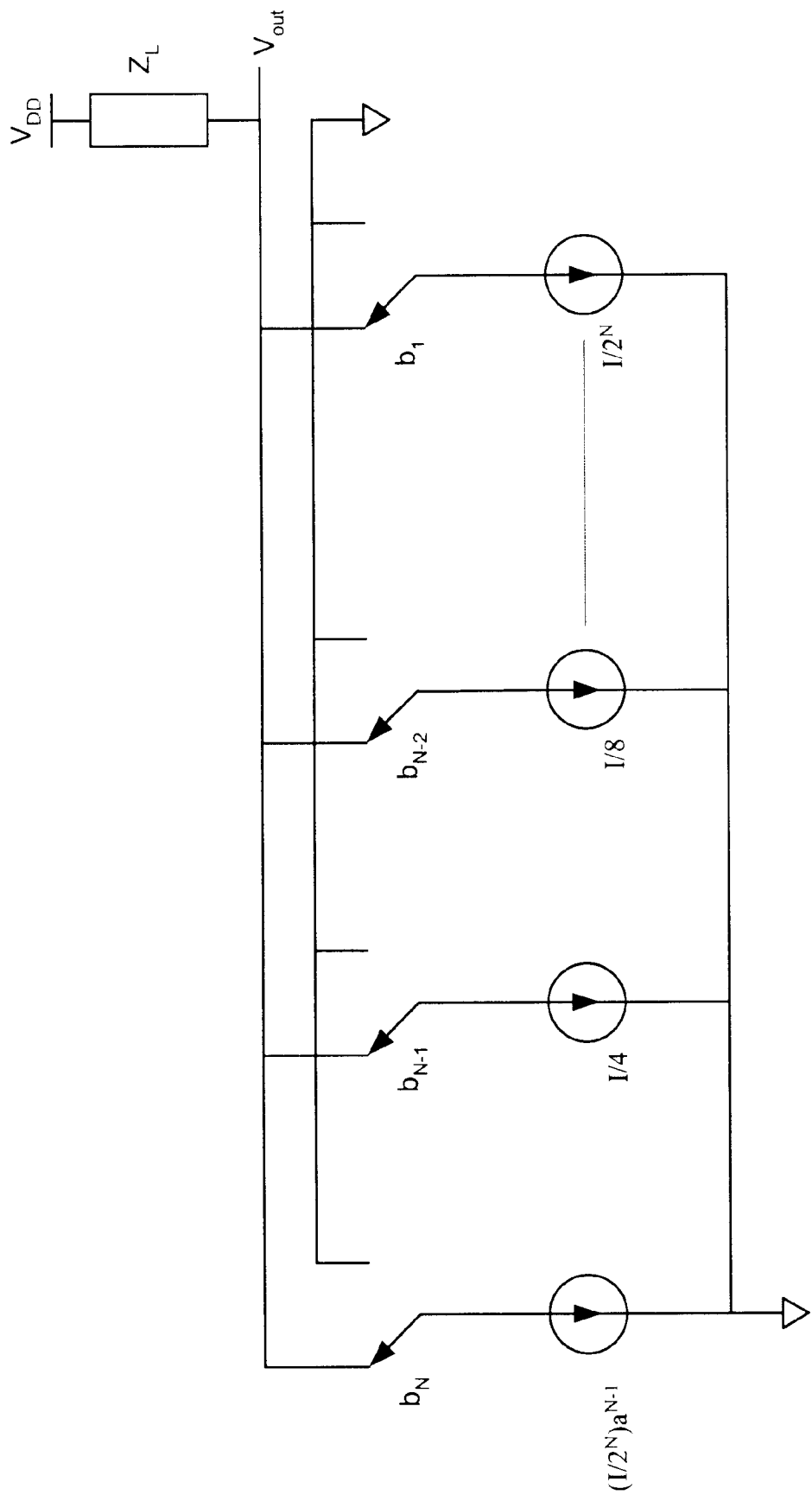
Figure 2A:
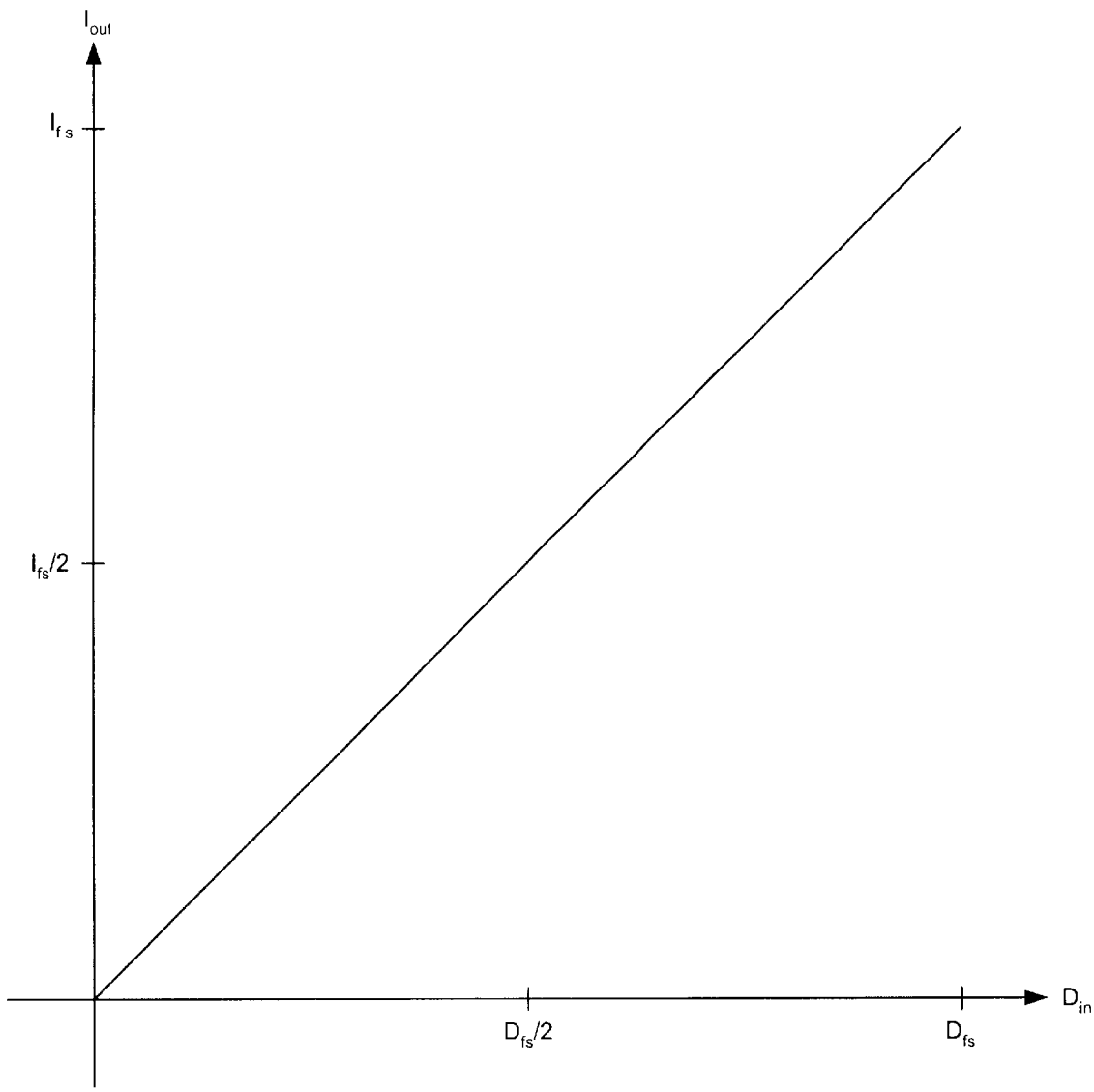
FIG. 2A is the transfer characteristics of an ideal binary-weighted current-steering DAC.
Figure 2B:
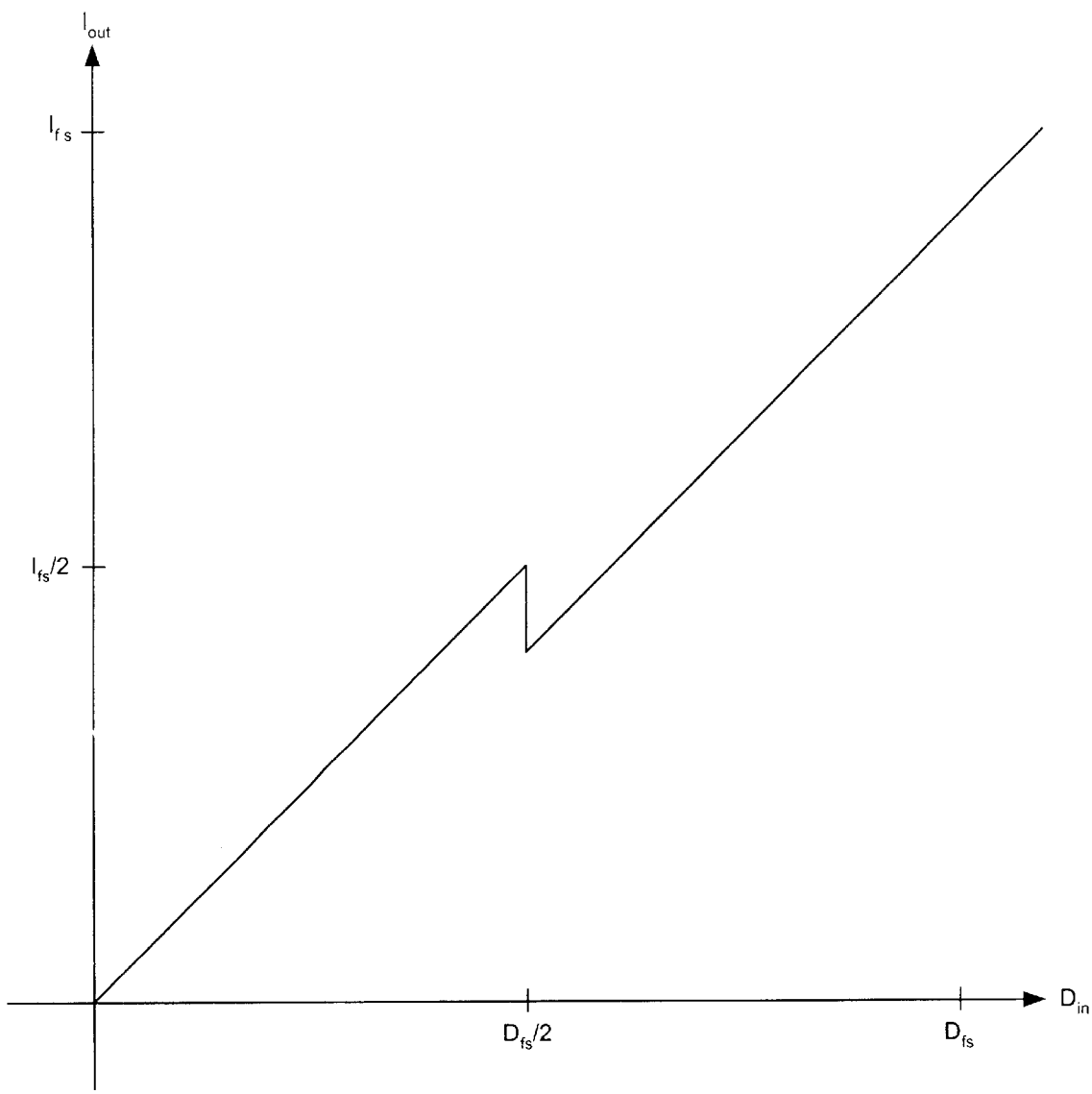
FIG. 2B is the transfer characteristics of a reduced-radix current-steering DAC.
Figure 3A:
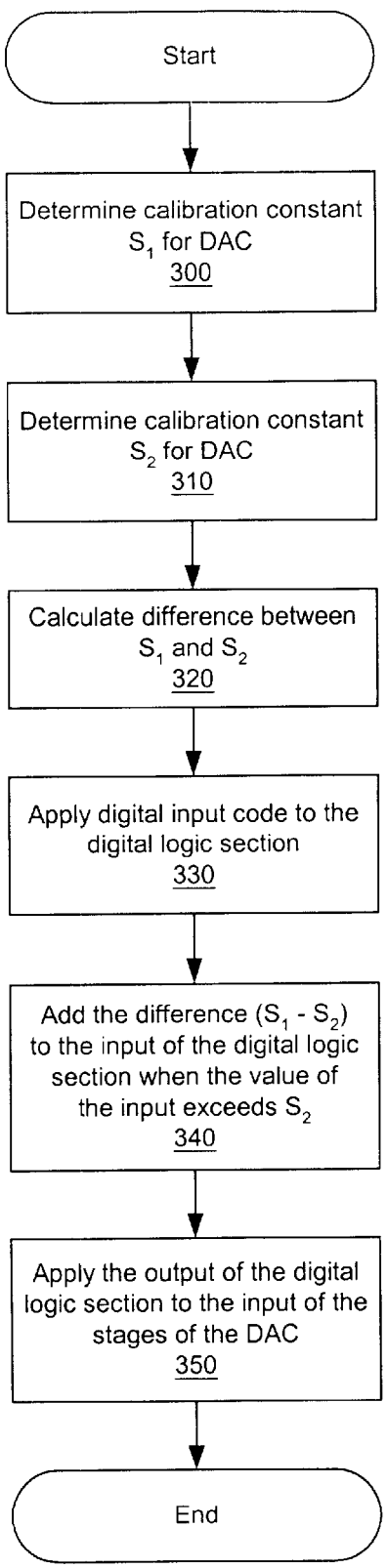
FIG. 3A is a flow chart of a method of one embodiment of a digital self-calibration technique for a reduced-radix current-steering DAC.

FIG. 3A is a method of a digital self-calibration technique for a reduced-radix DAC containing one reduced-radix stage. FIG. 3A describes the digital self-calibration technique as applied to a DAC derived from a current-steering implementation for purposes of illustration and ease of explanation. However, one should understand that the digital self-calibration technique can be applied to a DAC derived from other architectures, such as segmented, etc, and other implementations, such as charge redistribution, etc.

Self-calibration means that a DAC, under the environmental conditions that exist while the DAC is operating, corrects errors that affect the performance of the DAC. By contrast, an external calibration occurs when the DAC is manufactured, usually under environmental conditions different than those in which the DAC will operate. The self-calibration technique described herein is a digital technique because the DAC adjusts parameters in the digital domain (rather than the analog domain) to correct errors, i.e., reduce or even eliminate nonmonotonicity and nonlinearity caused by an uncalibrated reduced-radix stage.

The digital self-calibration technique is described as follows:

if $X<S_2$, then $Y=X$; and
if $X>S_2$, then $Y=X+S_1-S_2$,
  where X is the digital input code input to a digital calibration logic section that performs the self-calibration technique, Y is the output of the digital calibration logic section, and $S_1$ and $S_2$ are calibration constants determined as described below.

Figure 3B:
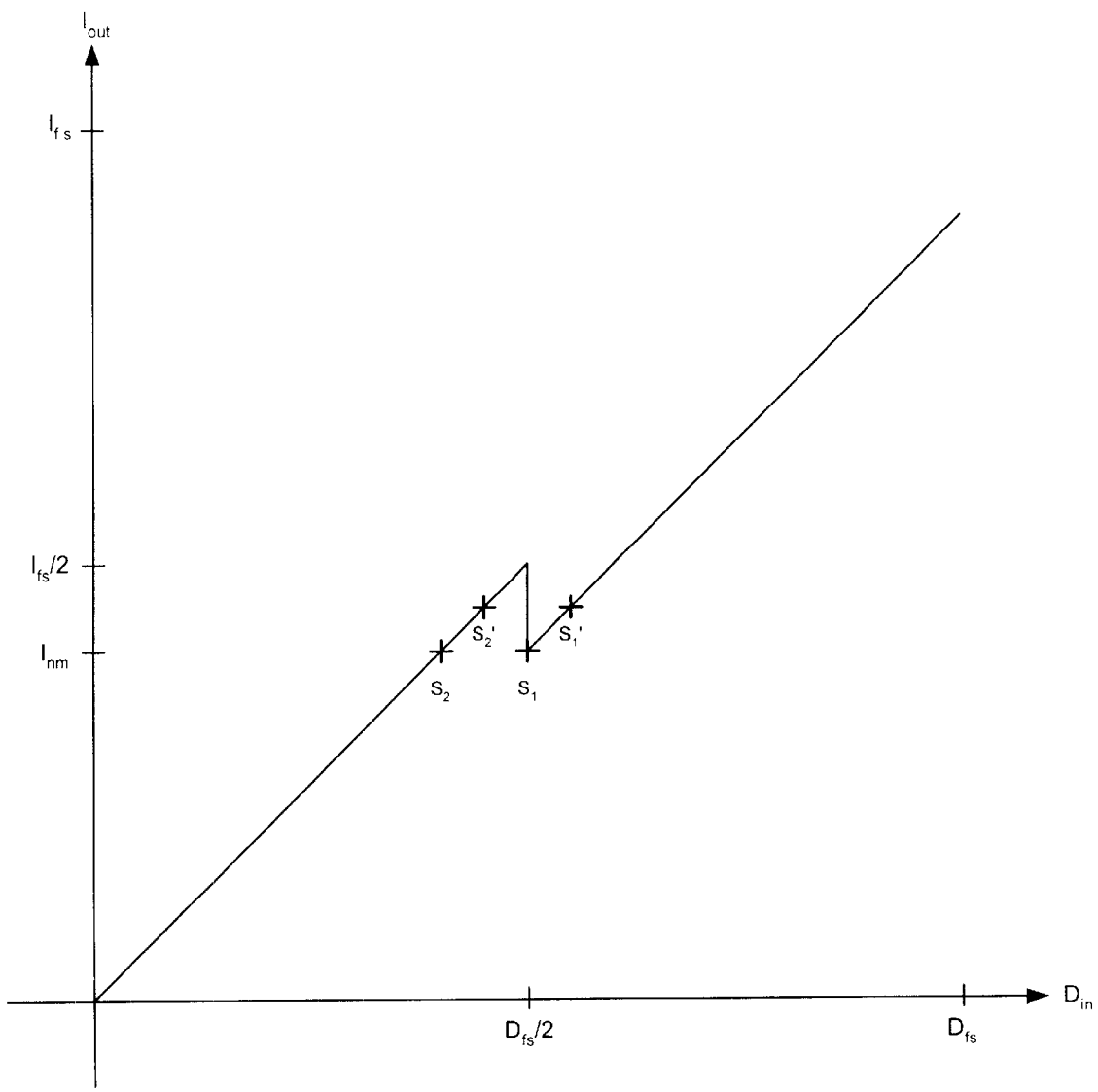
FIG. 3B is a transfer characteristic of a reduced-radix current-steering DAC which shows calibration constants.

At 300, $S_1$, the half full-scale value of the reduced-radix stage, is determined. $S_1$ is the digital input code value at which the transfer characteristic of the reduced-radix DAC (i.e., the DAC that does not contain the digital calibration logic section) is nonmonotonic and nonlinear and produces an analog output $I_{nm}$. At 310, $S_2$ is determined by decreasing the value of the digital input code from $S_1$ downward until the digital input code again produces the analog output $I_{nm}$. The digital input code value corresponding to this condition is $S_2$. The transfer characteristic in FIG. 3B shows $S_1$ and $S_2$. In one embodiment, $S_1$ and $S_2$ are determined using $I_{nm}$, as explained above. However, the amount of the difference between $S_1$ and $S_2$ is constant for any two digital input codes that produce the same analog output value contained in the range between $I_{nm}$ and $I_{fs}/2$, and thus $S_1-S_2=S_1'-S_2'$, as shown in FIG. 3B. Therefore, $S_1$ and $S_2$ can be determined using any analog output value between $I_{nm}$ and $I_{fs}/2$. At 320, the difference between $S_1$ and $S_2$ ($S_1-S_2$) is calculated.

At 330, digital input codes are applied to the input of the digital calibration logic section. At 340, the difference ($S_1-S_2$) is added to the digital input codes when the values of the digital input codes exceed $S_2$. When the values of the digital input codes are less than or equal to $S_2$, however, the difference ($S_1-S_2$) is not applied to the digital input codes. Thus, the digital input codes pass through the digital calibration logic section without adjustment because the digital input code has not reached the value that would cause the transfer characteristic of the reduced-radix DAC to be nonmonotonic and nonlinear. However, once the digital input code with a value exceeding $S_2$ is input to the digital calibration logic section, the digital input codes are adjusted as they pass though the digital calibration logic section before being input to the stages of the reduced-radix DAC. This is necessary because if the value of the digital input code to the reduced-radix DAC reached $S_1$, the transfer characteristic of the self-calibration DAC (i.e., the reduced-radix DAC with the digital calibration logic section added) would be nonmonotonic and nonlinear. However, adding the difference ($S_1-S_2$) causes the digital input codes with values greater than $S_2$ to avoid $S_1$ and the nonmonotonicity and nonlinearity that would occur at $S_1$. At 350, the outputs of the digital calibration logic section are applied to the stages of the self-calibration DAC to calibrate the reduced-radix stage and eliminate the nonmonotonicity and nonlinearity that would be present in the transfer characteristic of the reduced-radix DAC.

The digital self-calibration technique is described in terms of adding the difference ($S_1-S_2$) to the digital input code when the value of the digital input code exceeds $S_2$, and not adding ($S_{1-S2}$) when the value of the digital input code is less than or equal to $S_2$. However, the digital self-calibration technique can be implemented by adding the difference ($S_1-S_2$) to the digital input code when the value of the digital input code is equal to or greater than $S_2$, and not adding ($S_1-S_2$) when the value of the digital input code is less than $S_2$.

Figure 4A:
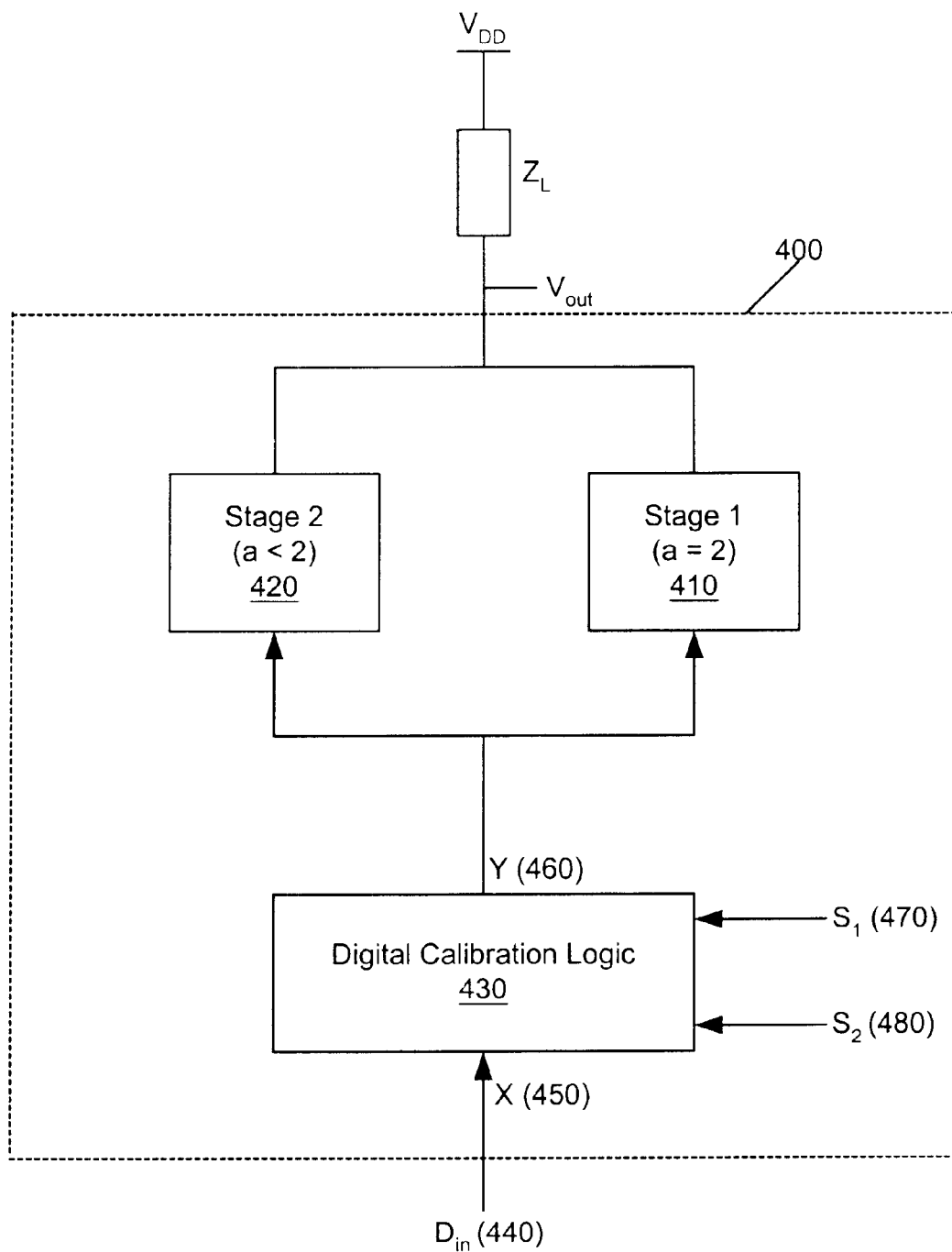
FIG. 4A is one embodiment of a DAC with a single reduced-radix stage to which the digital self-calibration technique is applied.
Figure 4B:
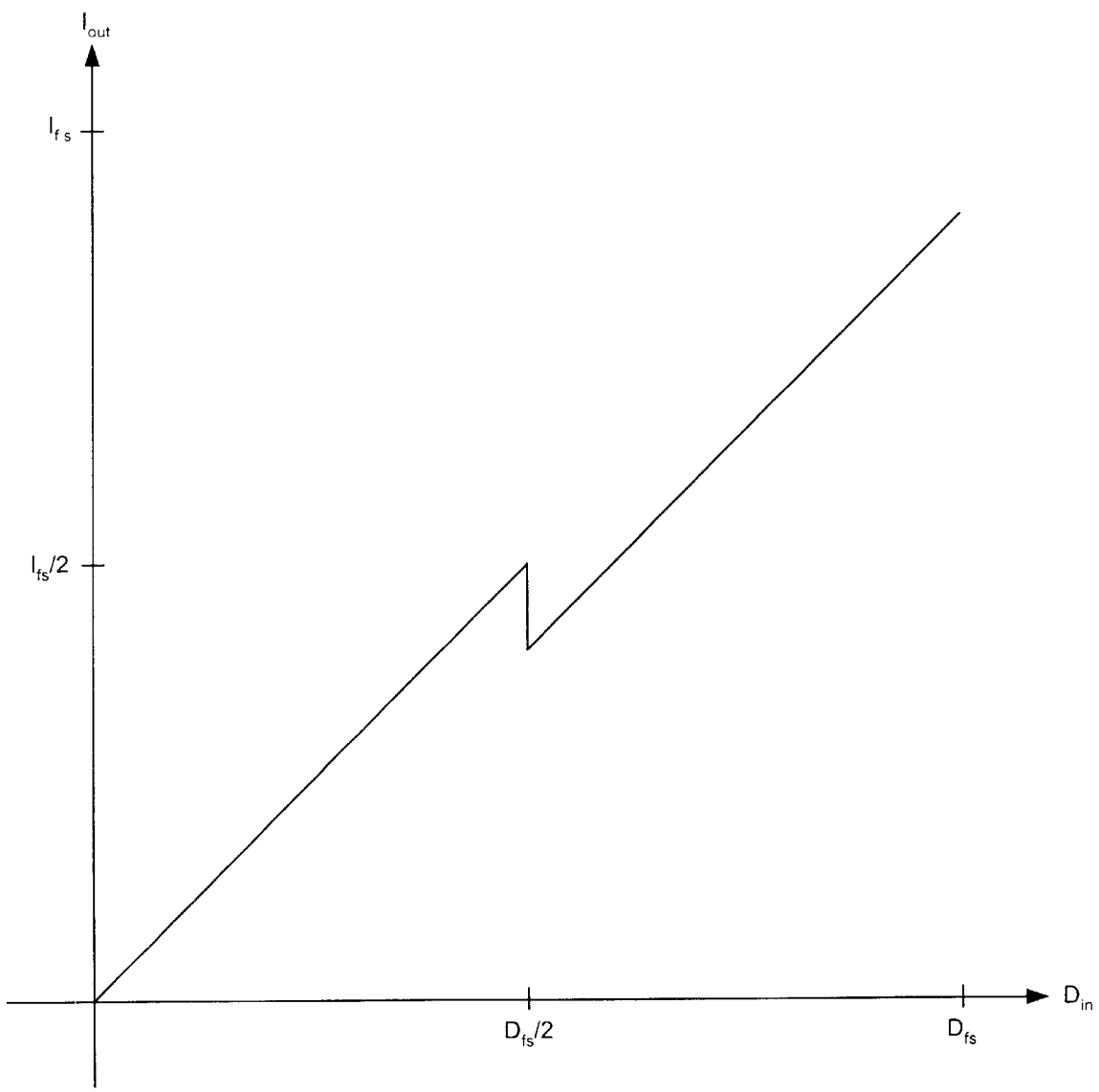
FIG. 4B is the transfer characteristic of a DAC with an uncalibrated reduced-radix stage.

FIG. 4A shows one embodiment of a DAC with a digital calibration logic section added to perform the digital self-calibration technique. DAC 400 consists of Stage One 410, an ideal binary-weighted stage, and Stage Two 420, a reduced-radix MSB stage, added to Stage One 410. The radix of Stage One 410 is 2 (i.e., a=2), while the radix of Stage Two 420 is a value less than 2, for example, 1.93 (i.e., a<2). The transfer characteristic of DAC 400 with an uncalibrated Stage Two 420 is shown in FIG. 4B.

Figure 4C:
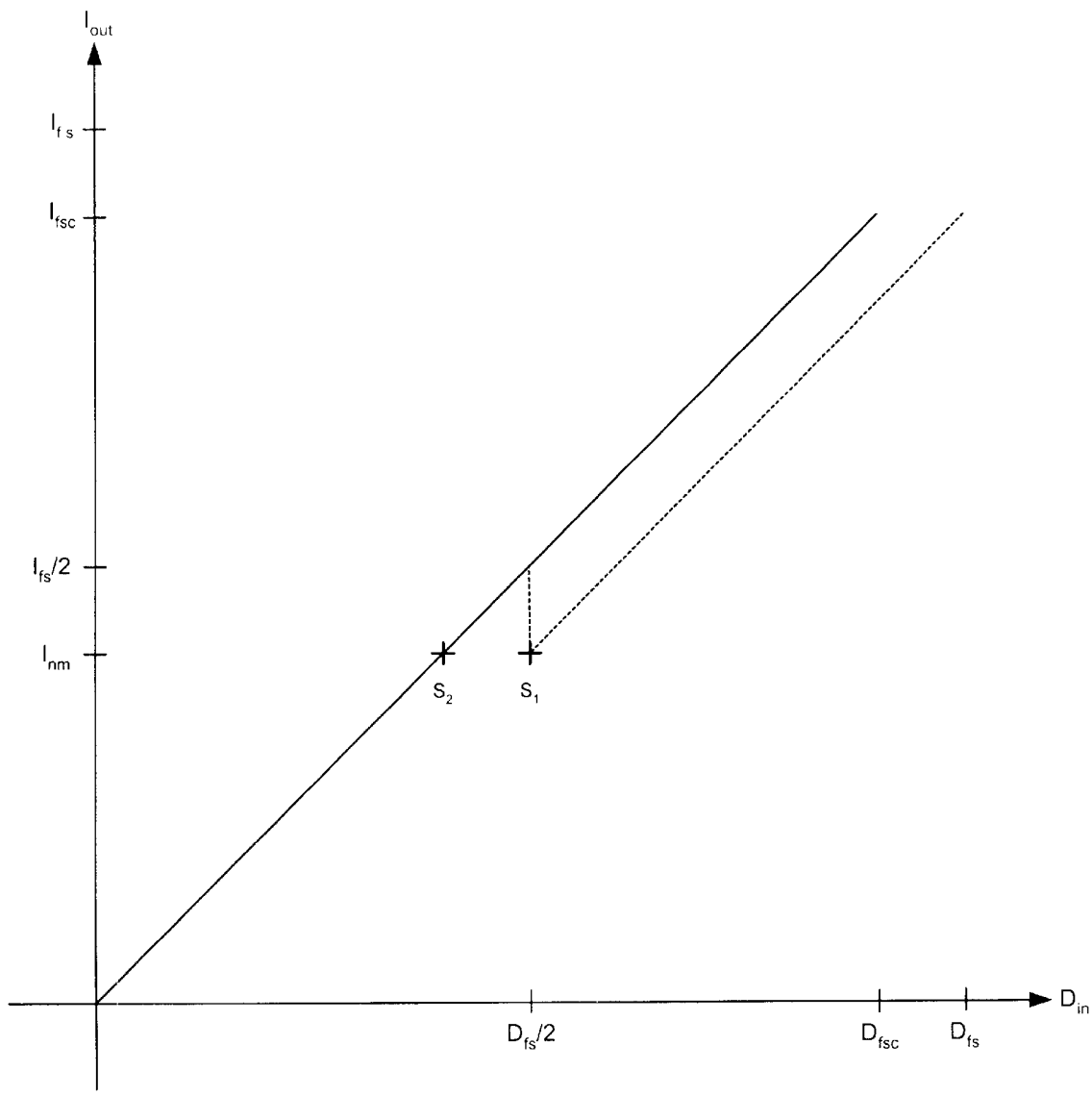
FIG. 4C is the transfer characteristic of a DAC with a calibrated reduced-radix stage.

Digital input codes $D_{in}$ 440 are applied to the input X 450 of digital calibration logic section 430, along with calibration constants $S_1$ 470 and $S_2$ 480 determined for Stage Two 420. Once the difference ($S_1-S_2$) between $S_1$ 470 and $S_2$ 480 is determined, the output Y 460 of digital calibration logic section 430 is adjusted for digital input code values greater than $S_2$, as explained previously. The outputs Y 460 of digital calibration logic section 430 are applied to the inputs of Stage One 410 and Stage Two 420 of DAC 400, thereby calibrating Stage Two 420. Thus, nonmonotonicity and nonlinearity that would be present in the transfer characteristic of DAC 400 if it did not contain digital calibration logic section 430 is eliminated. The transfer characteristic for DAC 400 with Stage Two 420 calibrated is shown in FIG. 4C.

Figure 5:
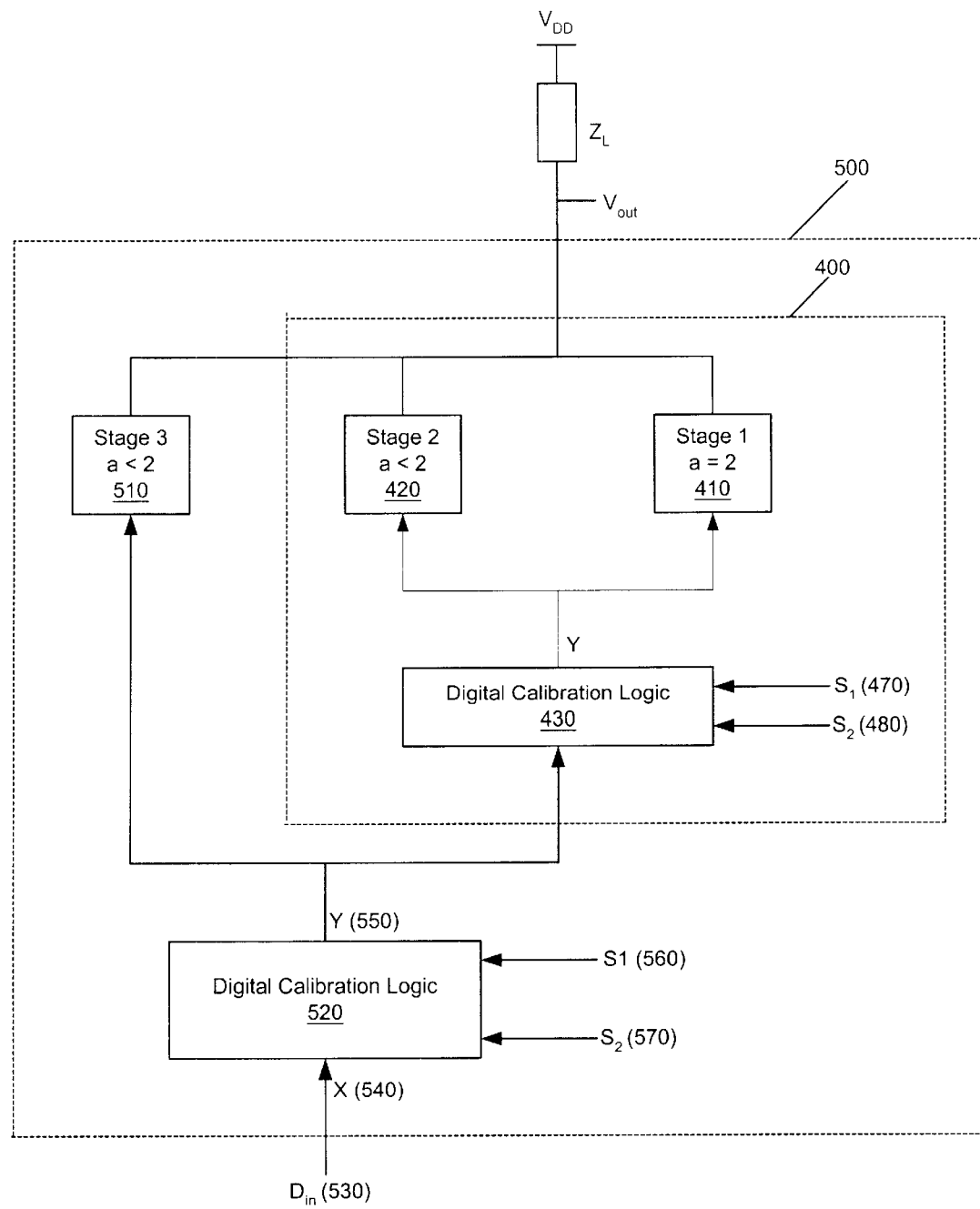
FIG. 5 is one embodiment of a reduced-radix DAC with multiple reduced-radix stages to which the digital self-calibration technique is applied.

FIG. 5 shows one embodiment of a DAC containing multiple reduced-radix stages to which the digital-self calibration technique is applied recursively. Initially, the digital self-calibration technique is applied to a DAC containing a digital calibration logic section, one or more ideal binary-weighted stages and one reduced-radix stage. If the DAC consists of additional reduced-radix stages, the digital self-calibration technique may be extended to the highest order reduced-radix stage after each successive lower order reduced-radix stage is calibrated. The digital self-calibration technique applied to DAC 400 was described in connection with FIG. 4A. Digital calibration logic 430 and calibration constants $S_1$ 470 and $S_2$ 480 were used to calibrate Stage Two 420.

In FIG. 5, DAC 500 consists of DAC 400 with Stage Two 420, which has been calibrated using digital calibration logic section 430, followed by Stage Three 510, an uncalibrated reduced-radix MSB stage. Two calibration constants $S_1$ and $S_2$ are required for each reduced-radix stage being calibrated. Thus, calibration constants $S_1$ 560 and $S_2$ 570 for Stage Three 510 are determined in a similar manner as calibration constants $S_1$ 470 and $S_2$ 480 were determined for Stage Two 420.

Digital calibration logic section 520 follows the same process described previously to produce outputs Y 550, as the digital self-calibration technique is repeated for the new reduced-radix stage, Stage Three 510, to adjust digital input codes with values that exceed $S_2$ 570. The outputs Y 550 of digital calibration logic section 520 are then applied to calibrate Stage Three 510 in order to eliminate the nonmonotonicity and nonlinearity that would be present in the transfer characteristic of DAC 500 if it did not contain digital calibration logic section 520. Additional reduced-radix stages are calibrated in this manner, using a separate digital calibration logic section for each stage and determining separate calibration constants for each stage. The lowest order reduced-radix stage is calibrated first, then each successive reduced-radix stage is calibrated until the MSB reduced-radix stage is calibrated. Thus, the digital self-calibration technique has a recursive property.

A reduced-radix stage produces nonmonotonicity and nonlinearity in the transfer characteristic of a DAC. The nonmonotonicity produced by the reduced-radix stage offers the potential to eliminate the nonlinearity using the digital self-calibration technique. Specifically, because of the nonmonotonicity caused by the reduced-radix stage, there exists a pair of digital input codes for the reduced-radix stage that produce the same analog output. The difference between the pair of digital input codes is calculated to determine the digital input code increase needed to avoid the nonmonotonicity. When the values of the digital input codes exceed the lower of this pair of digital input codes, the difference between the pair of digital input codes is added to the digital input codes. As a result, the digital self-calibration technique enables the DAC to produce a transfer characteristic that is monotonic and linear throughout.

In one embodiment, the digital calibration logic section implementing the digital self-calibration technique is applied to a DAC constructed out of reasonably ideal stages that enable the DAC to achieve reasonable linearity, to which a reduced-radix stage is added. However, it is possible to apply the digital calibration logic section implementing the digital self-calibration technique to a DAC constructed entirely out of reduced-radix stages.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A digital-to-analog converter, comprising:
   one or more ideal stages;
   a reduced-radix stage coupled with the one or more ideal stages; and
   a digital calibration logic section to operate on a calibration value, wherein the calibration value comprises a difference between a first calibration constant and a second calibration constant, and the calibration value is added to digital input codes input to the digital calibration logic section, when the value of the digital input codes exceed the value of the second calibration constant.

2. The digital-to-analog converter of claim 1, wherein the first calibration constant comprises a value of a first digital input code causing a transfer characteristic of the digital-to-analog converter to be nonmonotonic.

3. The digital-to-analog converter of claim 2, wherein the second calibration constant comprises a value of a second digital input code producing an analog output value equal to an analog output value corresponding to the first calibration constant.

4. The digital-to-analog converter of claim 3, wherein outputs of the digital calibration logic section provide inputs to all stages of the digital-to-analog converter.

5. The digital-to-analog converter of claim 4, further comprising an additional reduced-radix stage after the reduced-radix stage.

6. The digital-to-analog converter of claim 5, further comprising an additional digital calibration logic section providing outputs that are input to the digital calibration logic section and the additional reduced-radix stage.

7. The digital-to-analog converter of claim 6, wherein the calibration value further comprises a difference between a third calibration constant and a fourth calibration constant.

8. The digital-to-analog converter of claim 7, wherein the third calibration constant comprises a value of a third digital input code causing the transfer characteristic of the digital-to-analog converter to be nonmonotonic.

9. The digital-to-analog converter of claim 8, wherein the fourth calibration constant comprises a value of a fourth digital input code producing an analog output value equal to an analog output value corresponding to the third calibration constant.

10. A method, comprising:
    receiving one or more digital input codes;
    adding a difference between a first calibration constant and a second calibration constant when values of the digital input codes exceed a value of the second calibration constant; and outputting digital input codes to which the difference between the first calibration constant and the second calibration constant has not been added and digital input codes to which the difference between the first calibration constant and the second calibration constant has been added.

11. The method of claim 10, wherein the first calibration constant and the second calibration constant correspond to analog outputs with equal values.

12. The method of claim 11, wherein the first calibration constant comprises a first digital input code value at which a transfer characteristic of the digital-to-analog converter is nonmonotonic.

13. The method of claim 12, wherein the second calibration constant comprises a second digital input code value at which an analog output value equals an analog output value corresponding to the first calibration constant.

14. The method of claim 13, wherein the second calibration constant comprises a second alternate digital input code value.

15. The method of claim 14, wherein the second alternate digital input code value comprises a digital input code value less than the first calibration constant and corresponds to an analog output value equal to the analog output value corresponding to the first alternate digital input code value.

16. The method of claim 10, wherein a digital-to-analog converter is designed using the method of claim 10.

17. The method of claim 12, wherein the first calibration constant comprises a first alternate digital input code value.

18. The method of claim 17, wherein the first alternate digital input code value comprises a digital input code value greater than the first calibration constant and corresponds to an analog output between the analog output produced by the first calibration constant and an analog output at which the transfer characteristic of the digital-to-analog converter was monotonic immediately prior to becoming nonmonotonic.

19. A method, comprising:
adding a digital calibration logic section to a reduced-radix digital-to-analog converter;
determining a difference between a first calibration constant for a reduced-radix stage and a second calibration constant for the reduced-radix stage;
receiving digital input codes through the digital calibration logic section;
generating an unadjusted output of the digital calibration logic section when values of the digital input codes do not exceed a value of the second calibration constant, by passing the digital input codes through the digital calibration logic section unaffected;
generating an adjusted output of the digital calibration logic section when the values of the digital input codes exceed the value of the second calibration constant, by adding the difference between the first calibration constant and the second calibration constant to the digital input codes passing through the digital calibration logic section; and
inputting the unadjusted output of the digital calibration logic section and the adjusted output of the digital calibration logic section to all stages of the reduced-radix digital-to-analog converter.

20. The method of claim 19, wherein the first calibration constant comprises a first digital input code value at which a transfer characteristic of the digital-to-analog converter is nonmonotonic.

21. The method of claim 20, wherein the second calibration constant comprises a second digital input code value at which an analog output value equals an analog output value corresponding to the first calibration constant.

22. The method of claim 21, further comprising adding to the reduced-radix digital-to-analog converter an additional reduced-radix stage after the reduced-radix stage.

23. The method of claim 22, further comprising adding an additional digital calibration logic section providing outputs that are inputs to the digital calibration logic section and the additional reduced-radix stage.

24. The method of claim 23, further comprising:
determining a difference between a third calibration constant for the additional reduced-radix stage and a fourth calibration constant for the additional reduced-radix stage;
receiving digital input codes through the additional digital calibration logic section;
generating an unadjusted output of the additional digital calibration logic section when values of the digital input codes do not exceed a value of the fourth calibration constant, by passing the digital input codes through the additional digital calibration logic section unaffected;
generating an adjusted output of the additional digital calibration logic section when the values of the digital input codes exceed the value of the fourth calibration constant, by adding the difference between the third calibration constant and the fourth calibration constant to the digital input codes passing through the additional digital calibration logic section; and
inputting the unadjusted output of the additional digital calibration logic section and the adjusted output of the additional digital calibration logic section to the digital calibration logic section and the second reduced-radix stage.

25. The method of claim 24, wherein the third calibration constant comprises a third digital input code value at which the transfer characteristic of the reduced-radix digital-to-analog converter is nonmonotonic.

26. The method of claim 25, wherein the fourth calibration constant comprises a fourth digital input code value at which an analog output value equals an analog output value corresponding to the third calibration constant.

* * * * *